(12) United States Patent  
Kang (10) Patent No.: US 7,964,463 B2  
(45) Date of Patent: Jun. 21, 2011

(54) METHOD FOR FABRICATING SEMICONDUCTOR DEVICE INCLUDING VERTICAL CHANNEL TRANSISTOR

(75) Inventor: Sang-Kil Kang, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 63 days.

(21) Appl. No.: 12/492,552

(22) Filed: Jun. 26, 2009

(65) Prior Publication Data

US 2010/0120221 A1    May 13, 2010

(30) Foreign Application Priority Data

Nov. 13, 2008  (KR) .................. 10-2008-0112677

(51) Int. Cl.  
*H01L 21/336* (2006.01)
(52) U.S. Cl. ........ 438/270; 438/700; 438/742; 438/751; 438/430
(58) Field of Classification Search .......... 438/268–270, 438/702, 734, 735, 742, 745, 749–751, 756  
See application file for complete search history.

(56) References Cited

U.S. PATENT DOCUMENTS

| 7,368,352 | B2* | 5/2008 | Kim et al. ............... 438/268 |
| 7,776,694 | B2* | 8/2010 | Jang et al. ............... 438/270 |
| 7,858,477 | B2* | 12/2010 | Kim ........................ 438/270 |
| 2009/0170302 | A1* | 7/2009 | Shin et al. ................ 438/589 |
| 2009/0206443 | A1* | 8/2009 | Juengling ................. 257/506 |
| 2009/0242971 | A1* | 10/2009 | Cho et al. ................. 257/328 |
| 2009/0291551 | A1* | 11/2009 | Cho ........................ 438/585 |
| 2009/0294840 | A1* | 12/2009 | Gilgen et al. ............. 257/327 |
| 2009/0317954 | A1* | 12/2009 | Kim ........................ 438/268 |

FOREIGN PATENT DOCUMENTS

| KR | 100618875 | 9/2006 |
| KR | 100660881 | 12/2006 |

OTHER PUBLICATIONS

Notice of Preliminary Rejection issued from Korean Intellectual Property Office on Nov. 25, 2010.

* cited by examiner

*Primary Examiner* — Savitri Mulpuri  
(74) *Attorney, Agent, or Firm* — IP & T Group LLP (57) ABSTRACT

A method for fabricating a semiconductor device includes forming a plurality of pillar structures over a substrate, forming gate electrodes over sidewalls of the pillar structures, forming a sacrificial layer buried between the pillar structures, etching the sacrificial layer and the substrate to form trenches in the substrate, forming first inter-layer insulation patterns buried over the trenches and removing the remaining sacrificial layer at substantially the same time, and forming second inter-layer insulation patterns over the first inter-layer insulation patterns and buried between the pillar structures.

22 Claims, 12 Drawing Sheets

GENERATION OF BRIDGE IN DWL PAD REGION AFTER NIT STRIP

FIG. 4
(PRIOR ART)

PILLARS ARE BENT

METHOD FOR FABRICATING SEMICONDUCTOR DEVICE INCLUDING VERTICAL CHANNEL TRANSISTOR

CROSS-REFERENCE TO RELATED APPLICATIONS

The present invention claims priority of Korean patent application number 10-2008-0112677, filed on Nov. 13, 2008, the disclosure of which is incorporated by reference in its entirety.

BACKGROUND OF THE INVENTION

The present invention relates to a method for fabricating a semiconductor device, and more particularly, to a method for fabricating a semiconductor device including a vertical channel transistor.

The size of cells integrated on a substrate is becoming smaller as semiconductor devices are becoming highly integrated. A transistor in a gigabyte dynamic random access memory (DRAM) device generally requires a size of approximately $4F^2$, wherein F represents the minimum feature size. Thus, vertical channel transistor has been introduced as a way to increase the efficiency of cells by increasing the integration scale of a DRAM device as well as securing the channel length of the transistor. The vertical channel transistor includes a transistor in which a channel is formed in a direction extending upward and downward, that is, in a vertical direction, with a surround type vertical gate enclosing an active pillar which is vertically extended over a substrate.

Figure 1A:
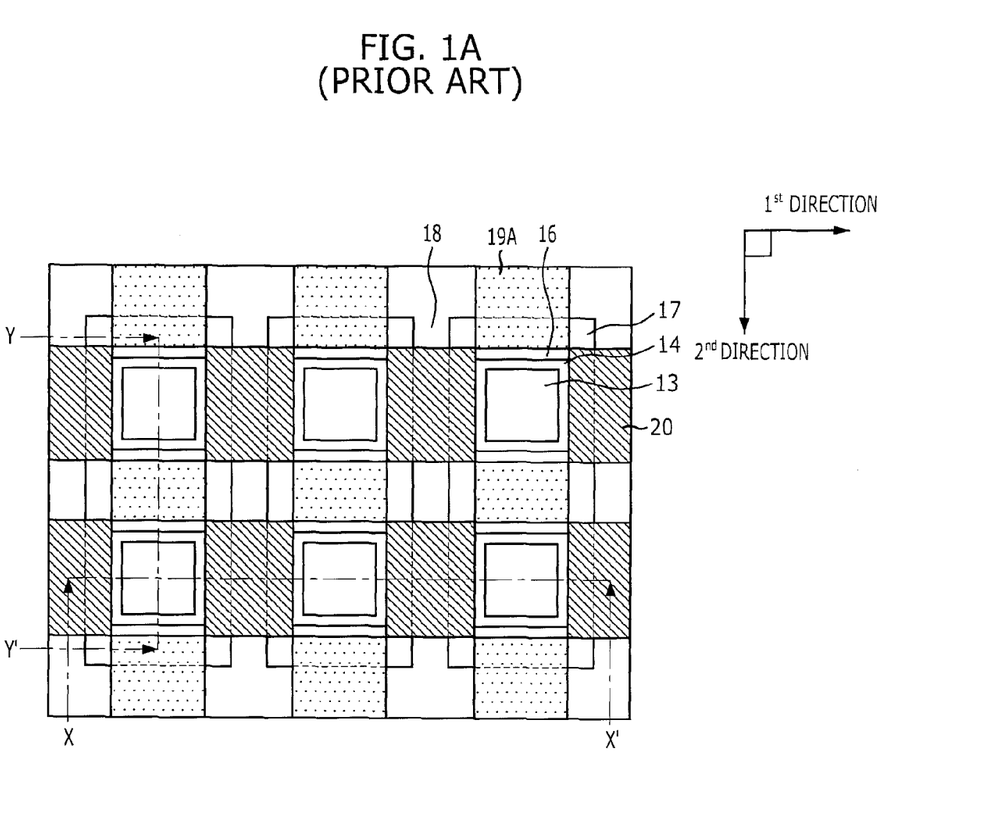
FIG. 1A illustrates a plan view of a semiconductor device including a typical vertical channel transistor.
Figure 1B:
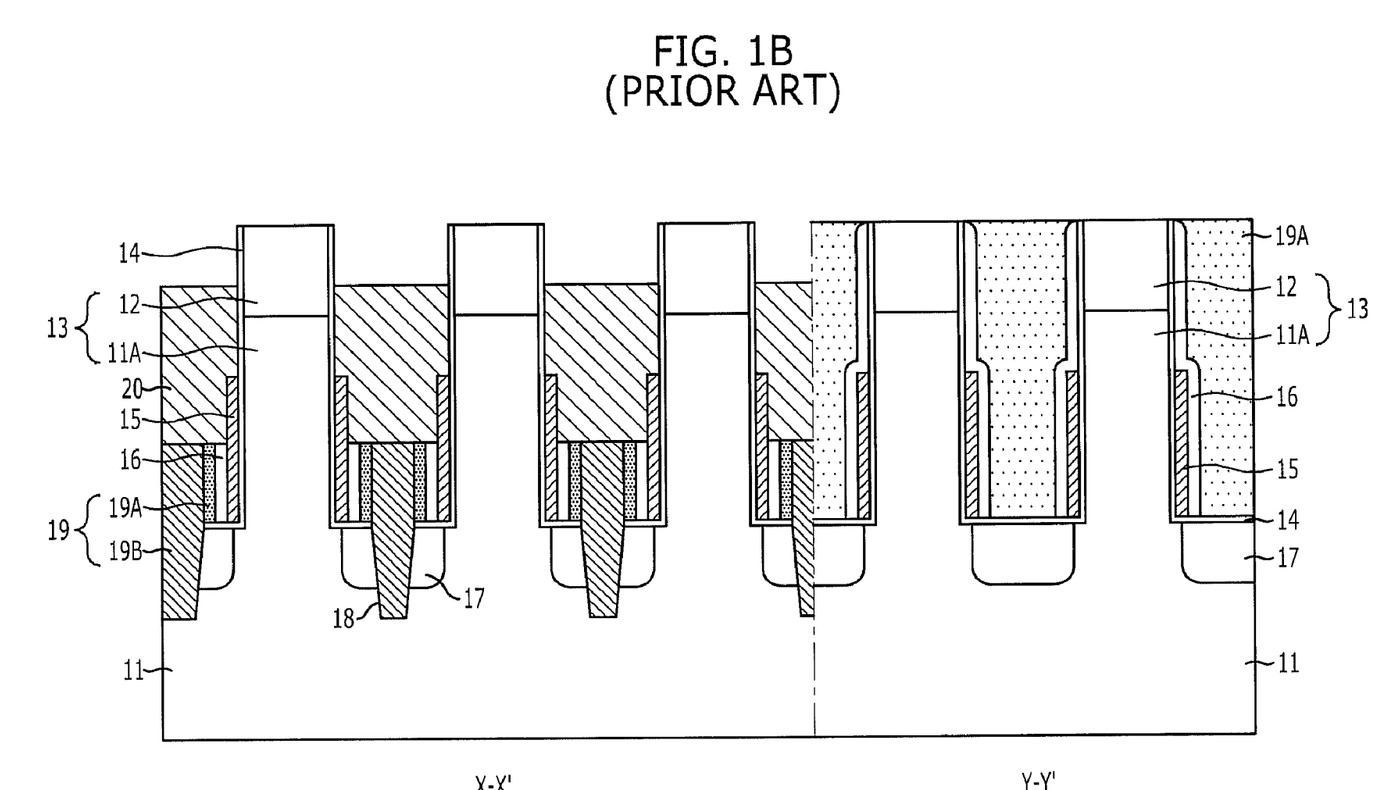
FIG. 1B illustrates cross-sectional views of the semiconductor device shown in FIG. 1A taken along lines X-X' and Y-Y'.

FIG. 1A illustrates a plan view of a semiconductor device including a typical vertical channel transistor. FIG. 1B illustrates cross-sectional views of the semiconductor device shown in FIG. 1A taken along lines X-X' and Y-Y'.

Referring to FIGS. 1A and 1B, a plurality of pillar structures 13 are formed over a substrate 11. Each of the pillar structures 13 includes a stack structure of an active pillar 11A and a hard mask layer 12. Vertical gates 15 are formed to enclose lower sidewalls of the active pillars 11A. Buried bit lines 17 are formed in the substrate 11 by performing an ion implantation process. The buried bit lines 17 are isolated from each other by trenches 18. Gate insulation layers 14 are formed between the vertical gates 15 and the active pillars 11A. Passivation layers 16 are formed over sidewalls of the pillar structures 13 including the vertical gates 15 along a second direction, i.e., along the direction of the line Y-Y'. Second inter-layer insulation layers 19B are formed in the trenches 18. First inter-layer insulation layers 19A are formed between the pillar structures 13 where word lines 20 are not formed. Reference denotation 19 represents inter-layer insulation layers 19 including the first inter-layer insulation layers 19A and the second inter-layer insulation layers 19B.

Figure 2:
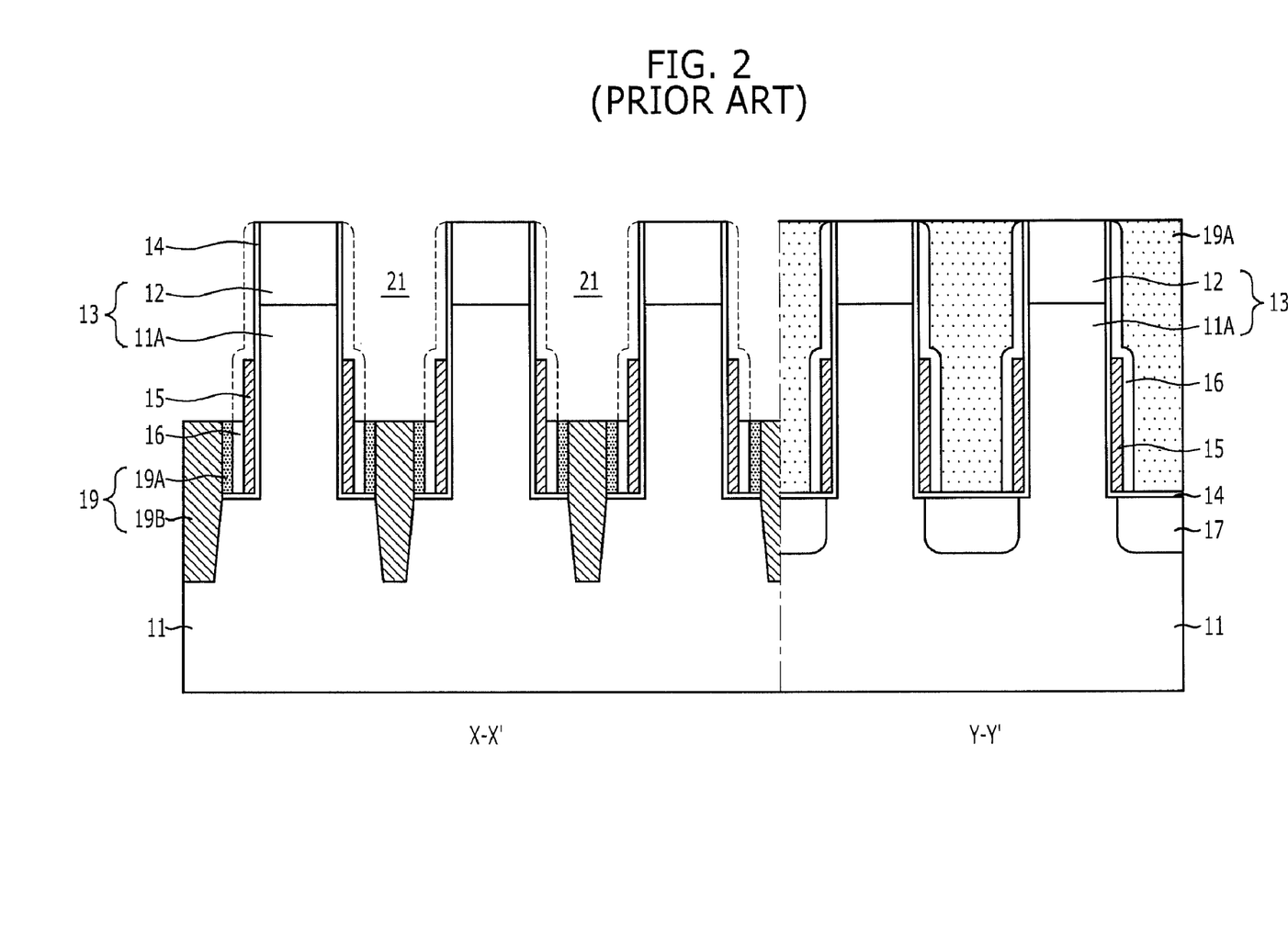
FIG. 2 illustrates cross-sectional views of a typical damascene word line process, the cross-sectional views taken along the lines X-X' and Y-Y' of the semiconductor device shown in FIG. 1A.

In this typical method, a damascene word line (DWL) process is used to form the word lines 20 coupling adjacent vertical gates 15 as illustrated in FIG. 2.

FIG. 2 illustrates cross-sectional views of a typical damascene word line process. The cross-sectional views are taken along the lines X-X' and Y-Y' of the semiconductor device shown in FIG. 1A.

A damascene word line process includes isolating the buried bit lines 17 using the trenches 18, forming the second inter-layer insulation layers 19B buried between the pillar structures 13, and etching the second inter-layer insulation layers 19B to form damascene patterns 21. The word lines 20 shown in FIG. 1B are to be buried over the damascene patterns 21.

However, considering the gap-fill characteristic and property of matter such as hardness, the first inter-layer insulation layers 19A include borophosphosilicate glass (BPSG) and the second inter-layer insulation layers 19B include a spin on dielectric (SOD) layer in the typical method. Also, the passivation layers 16 include a nitride-based layer to reduce conductive impurities contained in the first inter-layer insulation layers 19A, e.g., phosphorus (P), from penetrating into the active pillars 11A.

In the typical method, portions of the passivation layers 16 exposed by the damascene patterns 21 are removed after the damascene patterns 21 are formed. The passivation layers 16 are removed using phosphoric acid. However, the inter-layer insulation layers 19 may be damaged by phosphoric acid.

Figure 3:
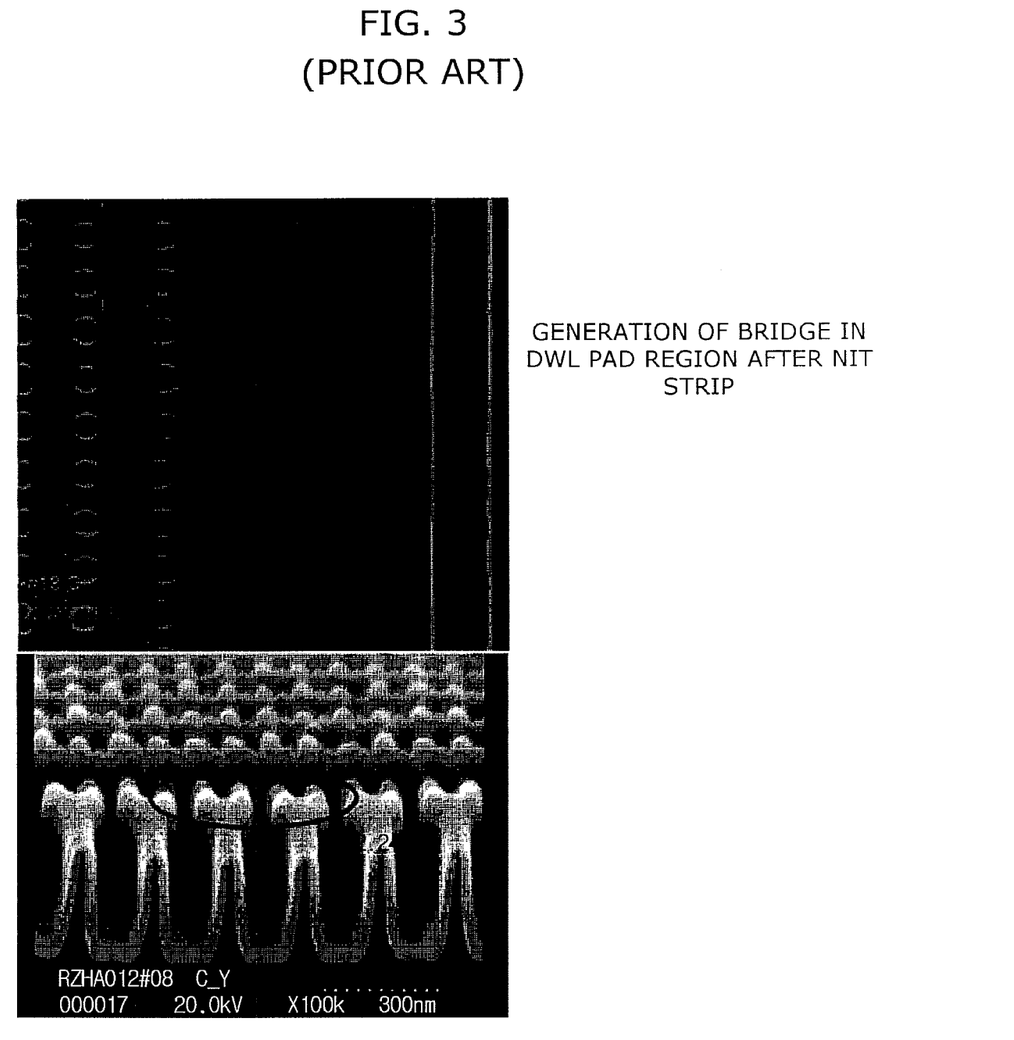
FIG. 3 illustrates a micrographic view showing bridges generated at the end of word lines in a padding region.

To be specific, as shown in FIG. 3, the first inter-layer insulation layers 19A may collapse in a padding region by phosphoric acid, causing bridges to form at the end of the word lines 20 in the padding region. The reason is because the first inter-layer insulation layers 19A including BPSG is more damaged by phosphoric acid than the second inter-layer insulation layers 19B including SOD.

Figure 4:
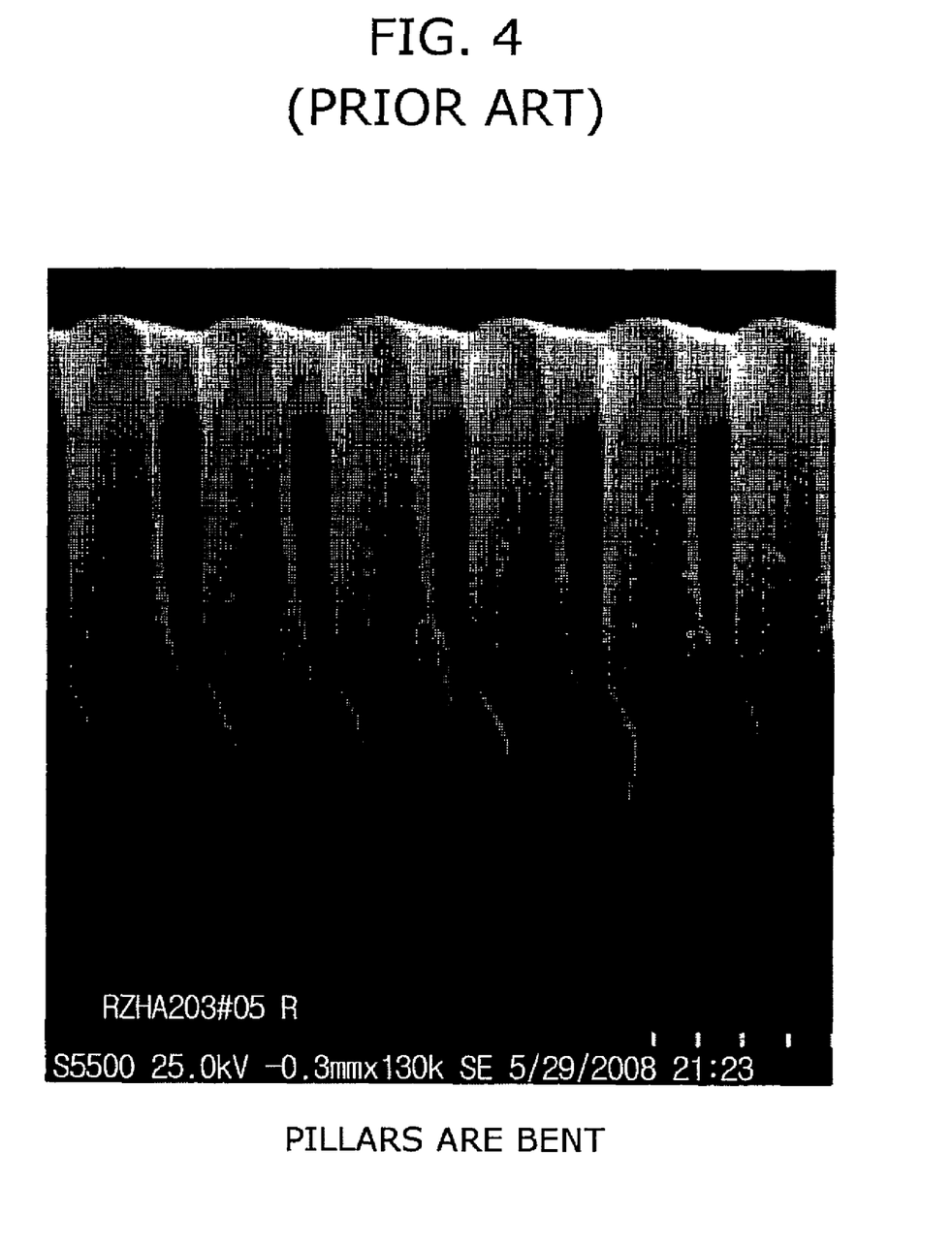
FIG. 4 illustrates a micrographic view showing bending of pillar structures caused by a stress of an inter-layer insulation layer.

In order to overcome such a limitation, a technology which forms the first inter-layer insulation layers 19A using a SOD layer like that of the second inter-layer insulation layers 19B has been suggested. However, if the thickness of the remaining first inter-layer insulation layers 19A is different from one side of the pillar structures 13 to the other along the first direction, i.e., the direction along the line X-X', due to a misalignment which may be generated during an etching process of the first inter-layer insulation layers 19A for forming the trenches 18, a stress imbalance may occur between the pillar structures 13 and the first inter-layer insulation layers 19A. Such stress imbalance may not cause much limitation if the first inter-layer insulation layers 19A are formed to include BPSG. However, if the first inter-layer insulation layers 19A are formed to include a SOD layer, the pillar structures 13 may bend as shown in FIG. 4. The reason is because SOD has a greater intra-layer stress than BPSG.

SUMMARY OF THE INVENTION

Embodiments of the present invention are directed to providing a method for fabricating a semiconductor device, which can reduce bridges from occurring at the end of word lines in a padding region when forming word lines in a semiconductor device including vertical channel transistors.

The embodiments of the present invention are also directed to providing a method for fabricating a semiconductor device, which can reduce bending of pillar structures when forming trenches for buried bit lines in a semiconductor device including vertical channel transistors.

In accordance with an aspect of the present invention, there is provided a method for fabricating a semiconductor device. The method includes forming a plurality of pillar structures over a substrate, forming gate electrodes over sidewalls of the pillar structures, forming a sacrificial layer buried between the pillar structures, etching the sacrificial layer and the substrate to form trenches in the substrate, forming first inter-layer insulation patterns buried over the trenches and removing the remaining sacrificial layer at substantially the same time; and forming second inter-layer insulation patterns over the first inter-layer insulation patterns and buried between the pillar structures.

The forming of the sacrificial layer may include using a material having a smaller intra-layer stress than the first inter-layer insulation patterns. The sacrificial layer may include a borophosphosilicate glass (BPSG) layer. The first inter-layer insulation patterns may include a spin on dielectric (SOD) layer.

In accordance with another aspect of the present invention, there is provided a method for fabricating a semiconductor device. The method includes forming a plurality of pillar structures over a substrate, forming gate electrodes over sidewalls of the pillar structures, forming an inter-layer insulation layer buried between the pillar structures, performing a first recess-etch process to recess the inter-layer insulation layer to a certain thickness, etching portions of the gate electrodes exposed by the first recess-etch process to form vertical gates, performing a second recess-etch process to recess the remaining inter-layer insulation layer to a certain thickness, thereby exposing portions of the vertical gates, forming a conductive layer buried between the pillar structures, and etching the conductive layer to form word lines coupling adjacent vertical gates.

After the forming of the gate electrodes, the method may further include performing an ion implantation process to implant impurities into portions of the substrate between the pillar structures to form impurity regions for forming buried bit lines, forming a passivation layer over the substrate structure, forming a sacrificial layer buried between the pillar structures, etching the sacrificial layer, the passivation layer, and the substrate to form trenches in the substrate, and removing the remaining sacrificial layer and passivation layer. The forming of the sacrificial layer may include using a material having a smaller intra-layer stress than the inter-layer insulation layer. The sacrificial layer may include a borophosphosilicate glass (BPSG) layer and the inter-layer insulation layer comprises a spin on dielectric (SOD) layer.

DESCRIPTION OF SPECIFIC EMBODIMENTS

Other objects and advantages of the present invention can be understood by the following description, and become apparent with reference to the embodiments of the present invention.

Embodiments of the present invention relate to a method for fabricating a semiconductor device including a vertical channel transistor. According to the embodiments of the present invention, a damascene pattern formation process for forming word lines may be omitted by forming the word lines by directly patterning a conductive layer, thus improving process efficiency. Furthermore, limitations which may arise while forming damascene patterns may be substantially reduced. Therefore, bridges may be prevented from occurring at the end of word lines in a padding region.

Moreover, according to the embodiments of the present invention, trenches for forming buried bit lines are formed using a sacrificial layer including borophosphosilicate glass (BPSG) having a smaller intra-layer stress than an inter-layer insulation layer including a spin on dielectric (SOD) layer. Consequently, pillar structures may not collapse even when a misalignment is generated while forming trenches. Also, spaces between pillar structures may be increased by removing a sacrificial layer and a passivation layer after trenches are formed.

Furthermore, according to the embodiments of the present invention, a first inter-layer insulation layer and a second inter-layer insulation layer are formed using substantially the same material, i.e., SOD. Thus, limitations which may arise due to a difference between processes being performed, in particular, a difference between etch rates, or degrees of etching, on inter-layer insulation layers caused by an etch gas or etch solution during an etching process may be prevented.

The embodiments of the present invention will be described in detail with reference to the accompanying drawings so that those ordinary persons skilled in the art may be able to embody the present invention with ease.

The embodiments of the present invention relate to a method for fabricating a semiconductor device including a vertical channel transistor, which can prevent bridges from occurring at the end of word lines in a padding region when forming the word lines and also prevent pillar structures from bending when forming trenches for forming buried bit lines.

Figure 5:
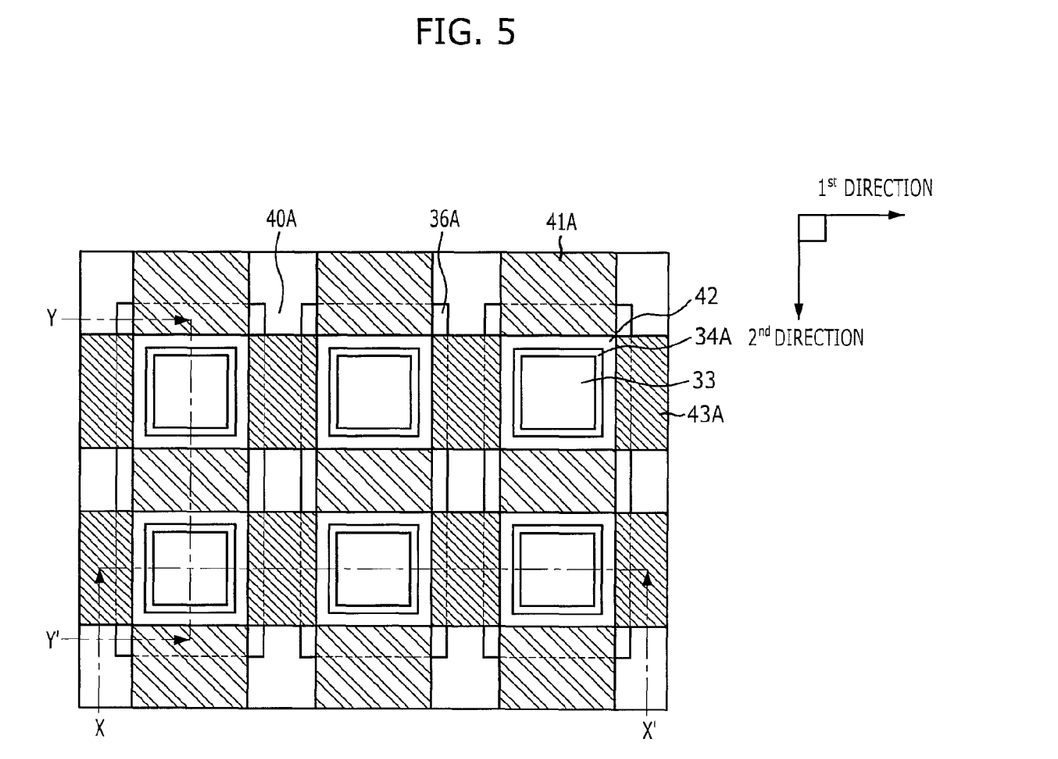
FIG. 5 illustrates a plan view of a semiconductor device including vertical channel transistors in accordance with an embodiment of the present invention.

FIG. 5 illustrates a plan view of a semiconductor device including vertical channel transistors in accordance with an embodiment of the present invention.

FIGS. 6A to 6F illustrate cross-sectional views of a method for fabricating a semiconductor device in accordance with the embodiment of the present invention, the cross-sectional views taken along the lines X-X' and Y-Y' of the semiconductor device shown in FIG. 5.

Figure 6A:
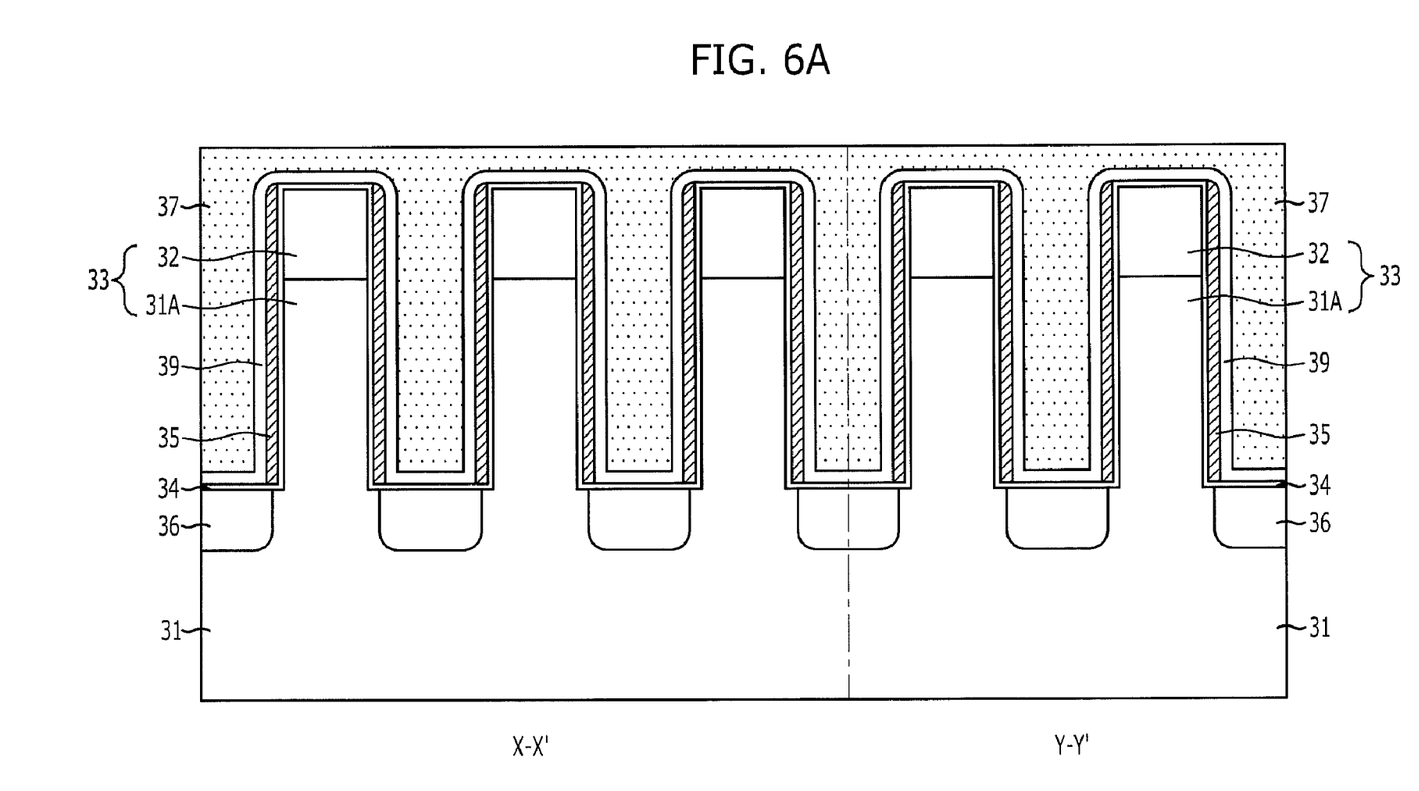
FIGS. 6A to 6F illustrate cross-sectional views of a method for fabricating a semiconductor device in accordance with the embodiment of the present invention, the cross-sectional views taken along the lines X-X' and Y-Y' of the semiconductor device shown in FIG. 5.

Referring to FIG. 6A, a plurality of pillar structures 33 are formed over a substrate 31. For instance, the substrate 31 may include a silicon substrate. Each of the pillar structures 33 may include a stack structure of an active pillar 31A and a hard mask layer 32. The pillar structures 33 may be formed in a rod type shape as illustrated or may be formed in a jar type shape (not shown) where the active pillars 31A are formed to include a head pillar and a neck pillar.

For instance, the pillar structures 33 in a rod type shape may be formed by forming the hard mask layers 32 over the substrate 31 and etching the substrate 31 using the hard mask layers 32 as an etch barrier to form the active pillars 31A. Therefore, the active pillars 31A include structures which are portions of the substrate 31 extended in a vertical direction.

The hard mask layers 32 include a nitride-based layer. For instance, the hard mask layers 32 may include a silicon nitride ($Si_3N_4$) layer having a thickness ranging from approximately 1,500 Å to approximately 2,000 Å. The hard mask layers 32 may also include one selected from a group consisting of an oxide-based layer, a nitride-based layer, an oxynitride layer, and a combination thereof.

A gate insulation layer 34 is formed over the substrate structure. The gate insulation layer 34 includes an oxide-based layer. For instance, the gate insulation layer 34 may include a silicon dioxide ($SiO_2$) layer.

Gate electrodes 35 are formed over portions of the gate insulation layer 34 formed over sidewalls of the pillar structures 33. The gate electrodes 35 may include a silicon (Si) layer or a metallic layer. The silicon layer may include a polysilicon layer and a silicon germanium (SiGe) layer, and the metallic layer may include a tungsten (W) layer, a titanium nitride (TiN) layer, and a tungsten silicide (WSi) layer. For instance, the gate electrodes 35 may include a metallic layer having a lower resistivity than a silicon layer. From the list of metallic layer described above, the gate electrodes 35 may include a TiN layer. The TiN layer may be used to form the gate electrodes 35 because the TiN layer has a more stable property of matter than other metallic layers, and at the same time, has a low resistivity.

The gate electrodes 35 are formed by forming a gate conductive layer over the gate insulation layer 34 and performing a blanket etch process, e.g., an etch-back process, in a manner that portions of the gate conductive layer remain over the sidewalls of the pillar structures 33.

Typical gate electrodes are generally formed to enclose bottom portions of sidewalls of the active pillars 31A (as represented with the vertical gates 15 shown in FIG. 1B). However, the gate electrodes 35 shown in this embodiment of the present invention are formed to enclose the entire sidewalls of the pillar structures 33, that is, sidewalls of the hard mask layers 32 and the active pillars 31A. The gate electrodes 35 are formed in such a shape to prevent the sidewalls of the pillar structures 33, in particular, the sidewalls of the hard mask layers 32, from getting damaged or lost during subsequent processes.

An ion implantation process is performed to implant impurities into portions of the substrate 31 between the pillar structures 33, thereby forming impurity regions 36. The impurity regions 36 function as buried bit lines through a subsequent process. At this time, the impurities may include boron (B), phosphorus (P), and arsenic (As).

A passivation layer 39 is formed over the substrate structure. The passivation layer 39 is formed to prevent conductive impurities contained in a subsequent sacrificial layer 37 including borophosphosilicate glass (BPSG) from penetrating into the active pillars 31A and the substrate 31. The passivation layer 39 may include a nitride-based layer, and the nitride-based layer may include a silicon nitride ($Si_3N_4$) layer.

The sacrificial layer 37 is formed over the passivation layer 39 to fill gaps between the pillar structures 33. For instance, the sacrificial layer 37 may be formed to fill the gaps between the pillar structures 33 and cover upper surfaces of the pillar structures 33.

The sacrificial layer 37 may include an oxide-based layer. The oxide-based layer may include a silicon dioxide ($SiO_2$) layer, a BPSG layer, a phosphosilicate glass (PSG) layer, a tetraethyl orthosilicate (TEOS) layer, an undoped silicate glass (USG) layer, a high density plasma (HDP) oxide layer, a spin on glass (SOG) layer, and a spin on dielectric (SOD) layer.

For instance, the sacrificial layer 37 may include BPSG, considering a spacing distance between the pillar structures 33, i.e., the filling characteristic, and an intra-layer stress. Note that a BPSG layer includes conductive impurities within the layer such as boron and phosphorus.

On the other hand, the sacrificial layer 37 may be formed using a SOD layer in order to simplify the process by omitting the formation process of the passivation layer 39. However, if the sacrificial layer 37 is formed to include a SOD layer, the pillar structures 33 may bend during subsequent processes due to a stress within the SOD layer. Note that a SOD layer includes a material having a greater intra-layer stress than BPSG.

Figure 6B:
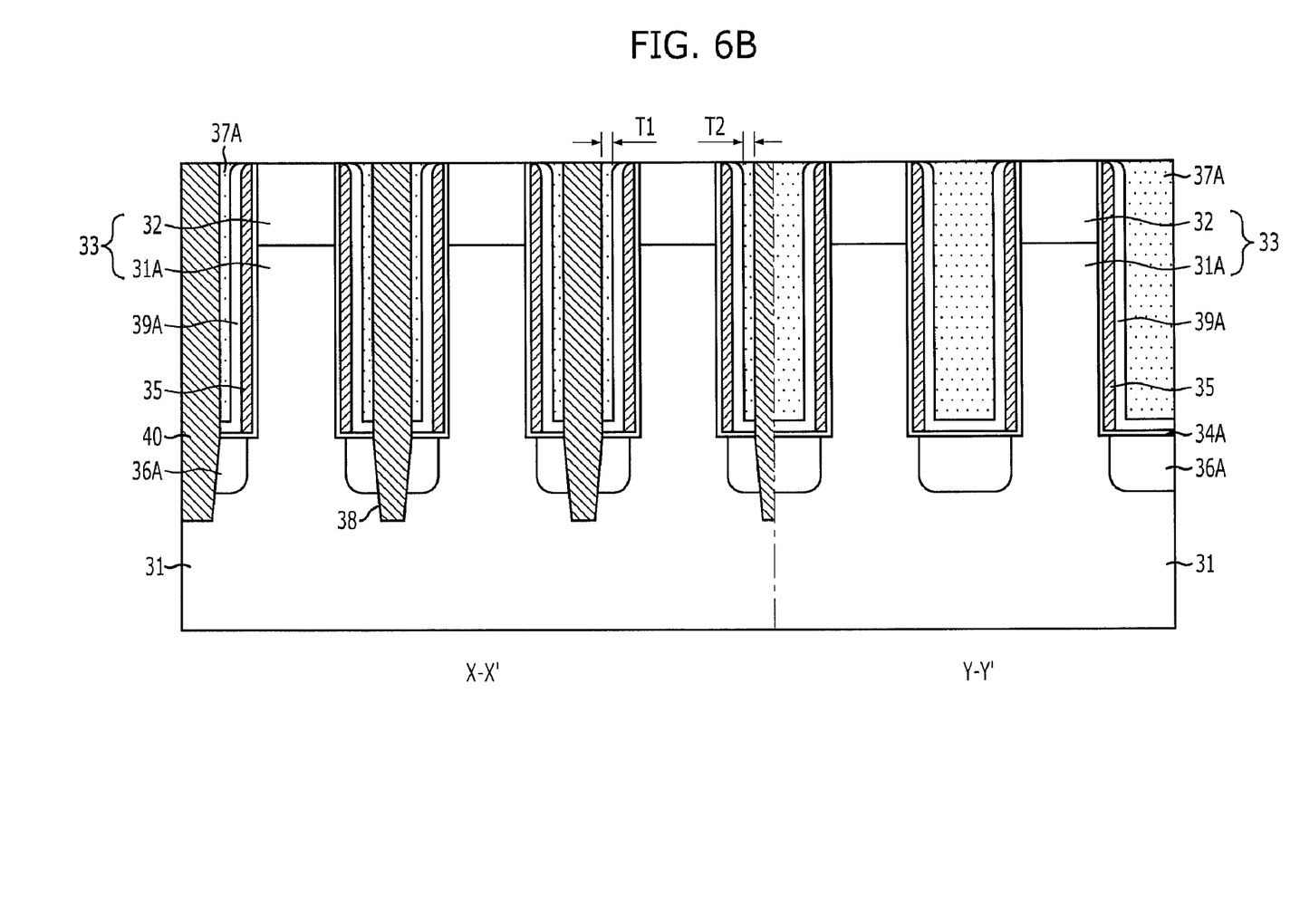

Referring to FIG. 6B, a photoresist pattern (not shown) is formed over the sacrificial layer 37. The sacrificial layer 37, the passivation layer 39, the gate insulation layer 34, and the substrate 31 are etched using the photoresist pattern as an etch barrier to form trenches 38 in the substrate 31. The trenches 38 are formed to isolate the impurity regions 36 to form buried bit lines 36A.

Meanwhile, a misalignment may occur while forming the trenches 38 as dimensions of semiconductor device according to design needs decrease. When a misalignment occurs, thicknesses T1 and T2 of remaining portions of the sacrificial layer 37 on both sides of the pillar structures 33 along a first direction, i.e., the direction along the line X-X', may differ from each other. Consequently, a stress imbalance may occur between the pillar structures 33 and the remaining portions of the sacrificial layer 37, causing the pillar structures 33 to bend. However, in this embodiment of the present invention, the sacrificial layer 37 is formed to include BPSG which has a smaller intra-layer stress than SOD so that the pillar structures 33 may not bend even if a misalignment occurs while forming the trenches 38.

A first inter-layer insulation layer is formed to fill the trenches 38 and gaps between the pillar structures 33 generated while forming the trenches 38. For instance, the first inter-layer insulation layer may be formed to fill the trenches 38 and the gaps between the pillar structures 33 and cover the upper surfaces of the pillar structures 33.

The first inter-layer insulation layer may include an oxide-based layer. For instance, the first inter-layer insulation layer may include a SOD layer which does not include conductive impurities such as phosphorus and boron.

On the other hand, the first inter-layer insulation layer may be formed to include BPSG like that of the sacrificial layer 37 to simplify subsequent processes. However, BPSG includes a material having a lesser filling characteristic than SOD. Thus, it may be difficult to use BPSG as the first inter-layer insulation layer for filling the trenches 38 and the gaps between the pillar structures 33 having a micro line width.

A planarization process is performed on the substrate structure until the upper surfaces of the pillar structures 33, i.e., upper surfaces of the hard mask layers 32, are exposed. The planarization process may include performing a chemical mechanical polishing (CMP) process. Reference denotations 34A, 37A, 39A, and 40 represent remaining gate insulation layers 34A, remaining sacrificial layers 37A, remaining passivation layers 39A, and first inter-layer insulation patterns 40, respectively.

Figure 6C:
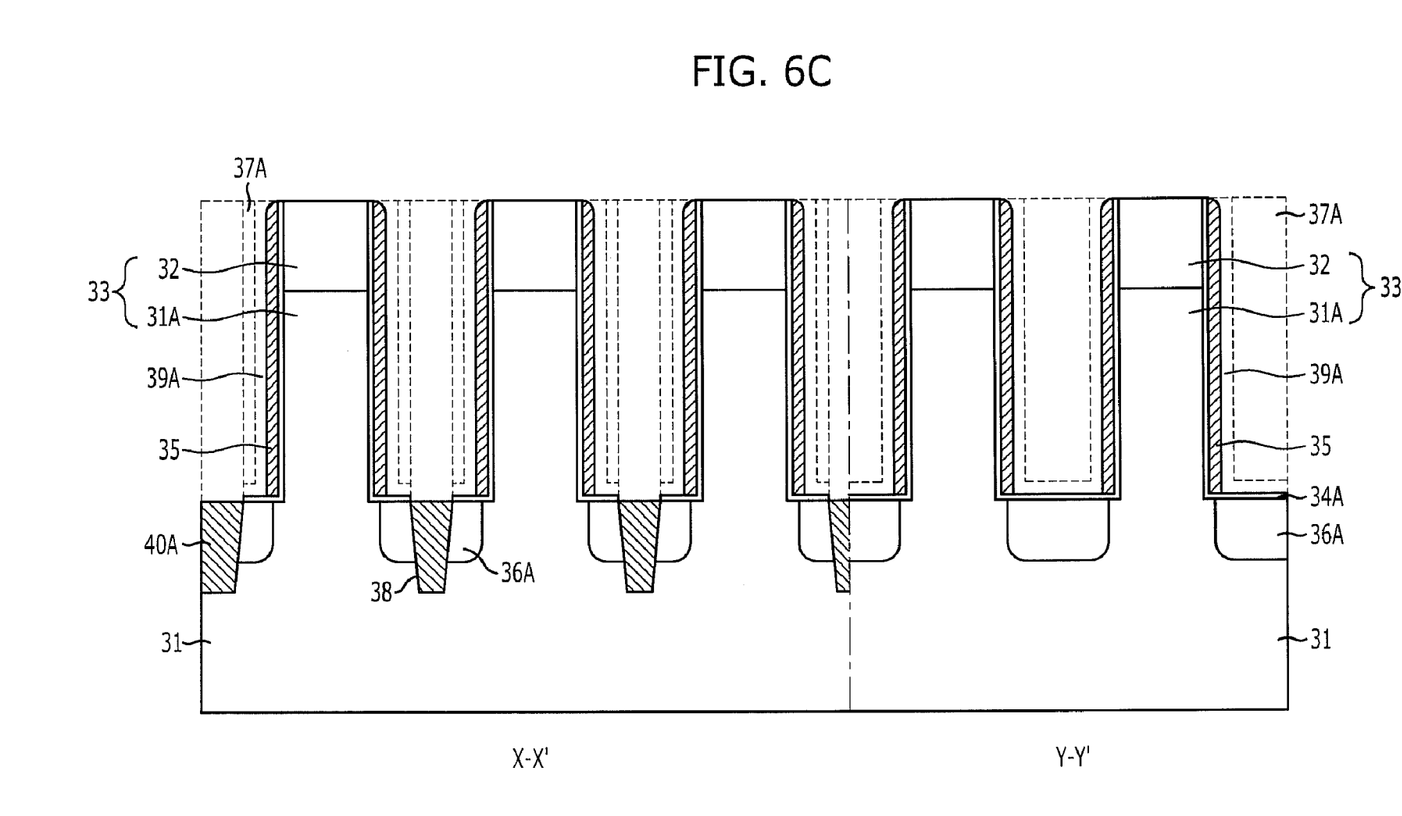

Referring to FIG. 6C, the first inter-layer insulation patterns 40 are recess-etched until the remaining passivation layers 39A are exposed, and at substantially the same time, the remaining sacrificial layers 37A are removed. For instance, remaining portions of the first inter-layer insulation patterns 40 may at least be filled in the trenches 38 by the time the recess-etch process is completed. Reference denotation 40A represents remaining first inter-layer insulation patterns 40A.

The recess-etch process may be performed using a dry etch, e.g., an etch-back process. At this time, a gas including fluorine (F) may be used as an etch gas. For instance, a gas including F having a selectivity of the remaining sacrificial layers 37A and the remaining first inter-layer insulation patterns 40A four times or greater than the hard mask layers 32 may be used, considering damages which may occur on the hard mask layers 32. That is, a gas including F having a selectivity between the hard mask layers 32 and the remaining sacrificial layers 37A and the remaining first inter-layer insulation patterns 40A of approximately 1:4 or greater may be used. For instance, if the hard mask layers 32 include a nitride-based layer and the remaining sacrificial layers 37A and the remaining first inter-layer insulation patterns 40A include oxide-based layers, a gas including F having an etch selectivity of at least fourfold among the layers may be used. For example, a fluorocarbon gas including octafluorocyclobutane ($C_4F_8$) gas may be used.

Limitations which may arise during subsequent processes may be prevented because the remaining sacrificial layers 37A are removed at this time. For instance, limitations which may arise from the difference between etch rates, or degrees of etching, of oxide-based layers using phosphoric acid may be prevented when removing the remaining passivation layers 39A using phosphoric acid.

Meanwhile, the gate electrodes 35 remaining over sidewalls of the hard mask layers 32 effectively prevent the sidewalls of the hard mask layers 32 from getting damaged or lost during the above described processes.

The exposed remaining passivation layers 39A are removed. The remaining passivation layers 39A may be removed by performing a wet etch process, and the wet etch process may use phosphoric acid.

By removing the remaining passivation layers 39A, a spacing distance between the pillar structures 33 along the first direction, i.e., the direction along the line X-X', and a second direction, i.e., a direction along the line Y-Y', may be increased. Thus, a space margin for subsequent processes is increased, and thus the degree of difficulty in performing the subsequent processes is lessened.

Meanwhile, portions of the hard mask layers 32 may be damaged while removing the remaining passivation layers 39A using phosphoric acid. However, the gate electrodes 35 remain over the sidewalls of the hard mask layers 32 while removing the remaining passivation layers 39A, thereby preventing losses of the sidewalls of the hard mask layers 32. Also, the thickness of portions of the hard mask layers 32 being lost during the removal process of the remaining passivation layers 39A may be of a negligible quantity compared to the total thickness of the hard mask layers 32 because the hard mask layers 32 has a thickness greater than the remaining passivation layers 39A.

Figure 6D:
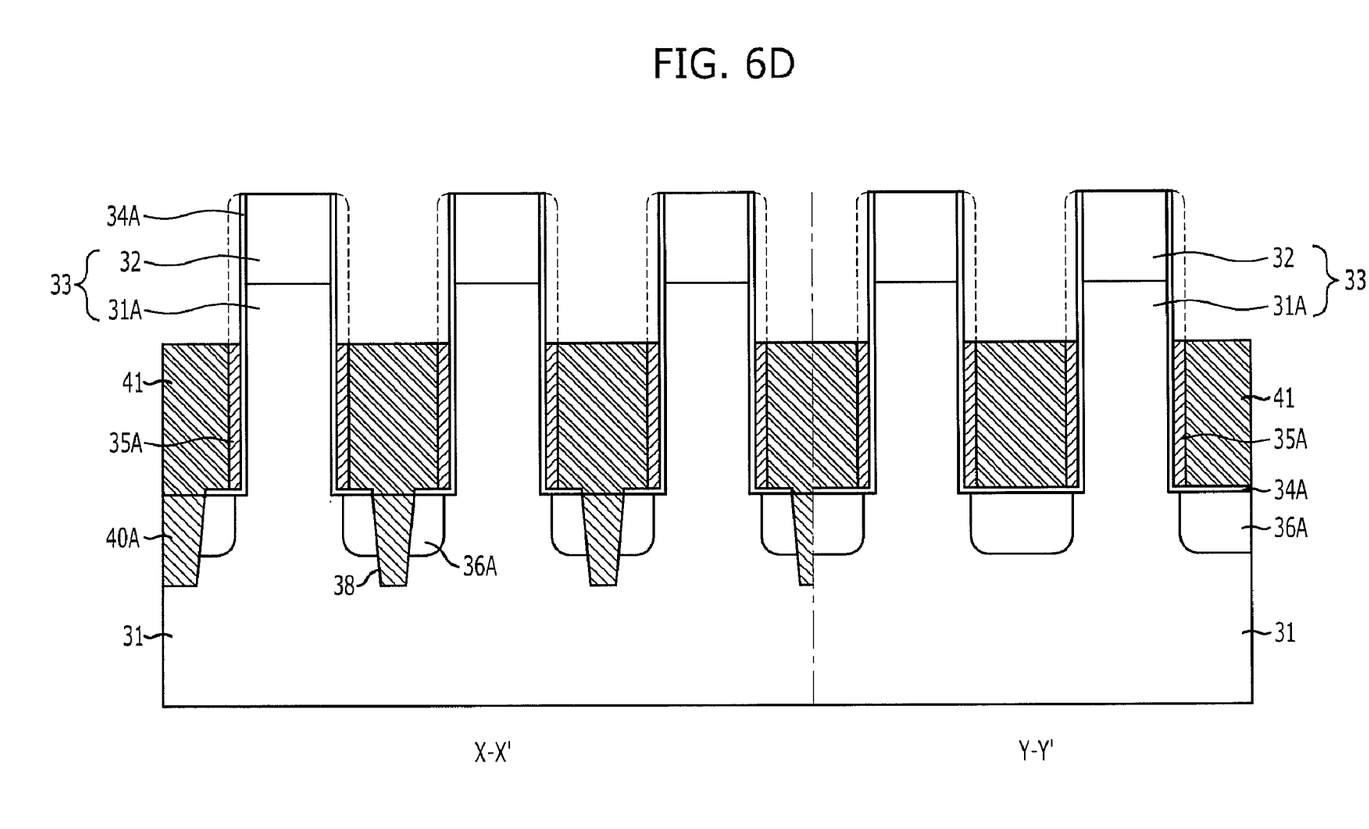

Referring to FIG. 6D, second inter-layer insulation patterns 41 are formed to fill bottom portions between the pillar structures 33. For instance, the second inter-layer insulation patterns 41 include substantially the same material as that of the remaining first inter-layer insulation patterns 40A. Thus, the second inter-layer insulation patterns 41 may include a SOD layer.

The second inter-layer insulation patterns 41 filling the bottom portions between the pillar structures 33 may be formed by forming a second inter-layer insulation layer to fill gaps between the pillar structures 33, and recess-etching the second inter-layer insulation layer to a certain thickness (hereinafter referred to as a first recess-etch process) so that the second inter-layer insulation patterns 41 remain over the bottom portions between the pillar structures 33.

The first recess-etch process may include performing a wet etch process and use a solution including fluorine as an etch solution. The solution including fluorine may include buffered oxide etchant (BOE) and hydrogen fluoride (HF) solution. At this time, the thickness of the second inter-layer insulation layer being etched may be controlled by controlling the etch time.

Portions of the gate electrodes 35 exposed by the second inter-layer insulation patterns 41 are etched to form vertical gates 35A enclosing lower sidewalls of the active pillars 31A. The vertical gates 35A are formed to provide spaces for forming source regions or drain regions over the active pillars 31A.

Figure 6E:
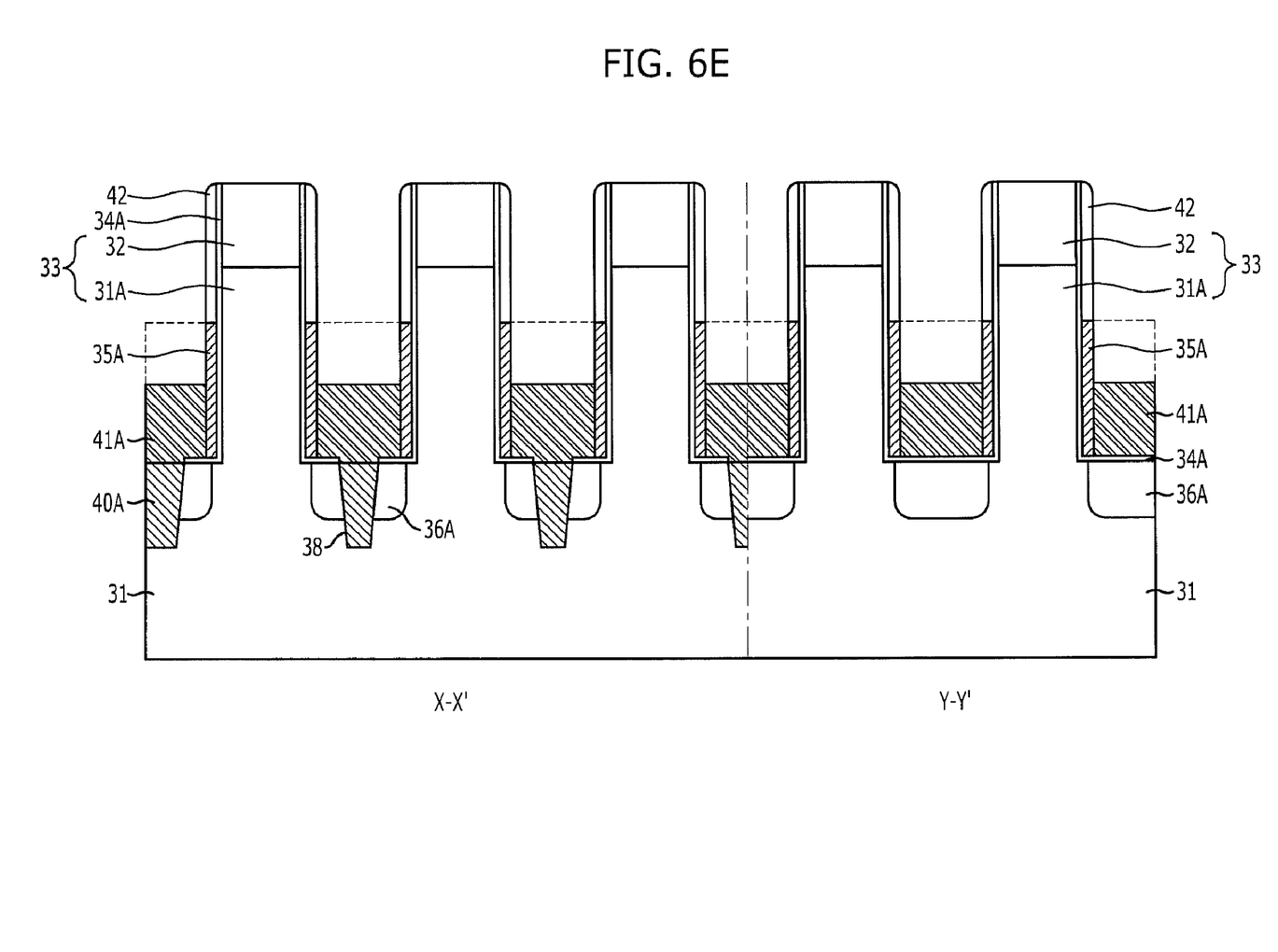

Referring to FIG. 6E, spacers 42 are formed over portions of the pillar structures 33 where the second inter-layer insulation patterns 41 are not formed. That is, the spacers 42 are formed over exposed portions of the sidewalls of the pillar structures 33. In detail, the spacers 42 are formed in a manner to cover the sidewalls of the hard mask layers 32, upper sidewalls of the active pillars 31A, and upper surfaces of the vertical gates 35A. The spacers 42 are formed to protect the pillar structures 33 and the vertical gates 35A during a subsequent word line formation process. The spacers 42 may include a nitride-based layer, and the nitride-based layer may include a silicon nitride layer.

For instance, the spacers 42 may be formed to have a thickness substantially the same as that of the vertical gates 35A.

The second inter-layer insulation patterns 41 are recess-etched to a certain thickness (hereinafter referred to as a second recess-etch process) to expose portions of the vertical gates 35A. Reference denotation 41A represents remaining second inter-layer insulation patterns 41A.

The second recess-etch process may be performed using substantially the same method as the first recess-etch process. That is, the second recess-etch process may include performing a wet etch process and using a solution including fluorine as an etch solution. The solution including fluorine may include buffered oxide etchant (BOE) and hydrogen fluoride (HF) solution. At this time, the thickness of the second inter-layer insulation patterns 41 being etched may be controlled by controlling the etch time.

Figure 6F:
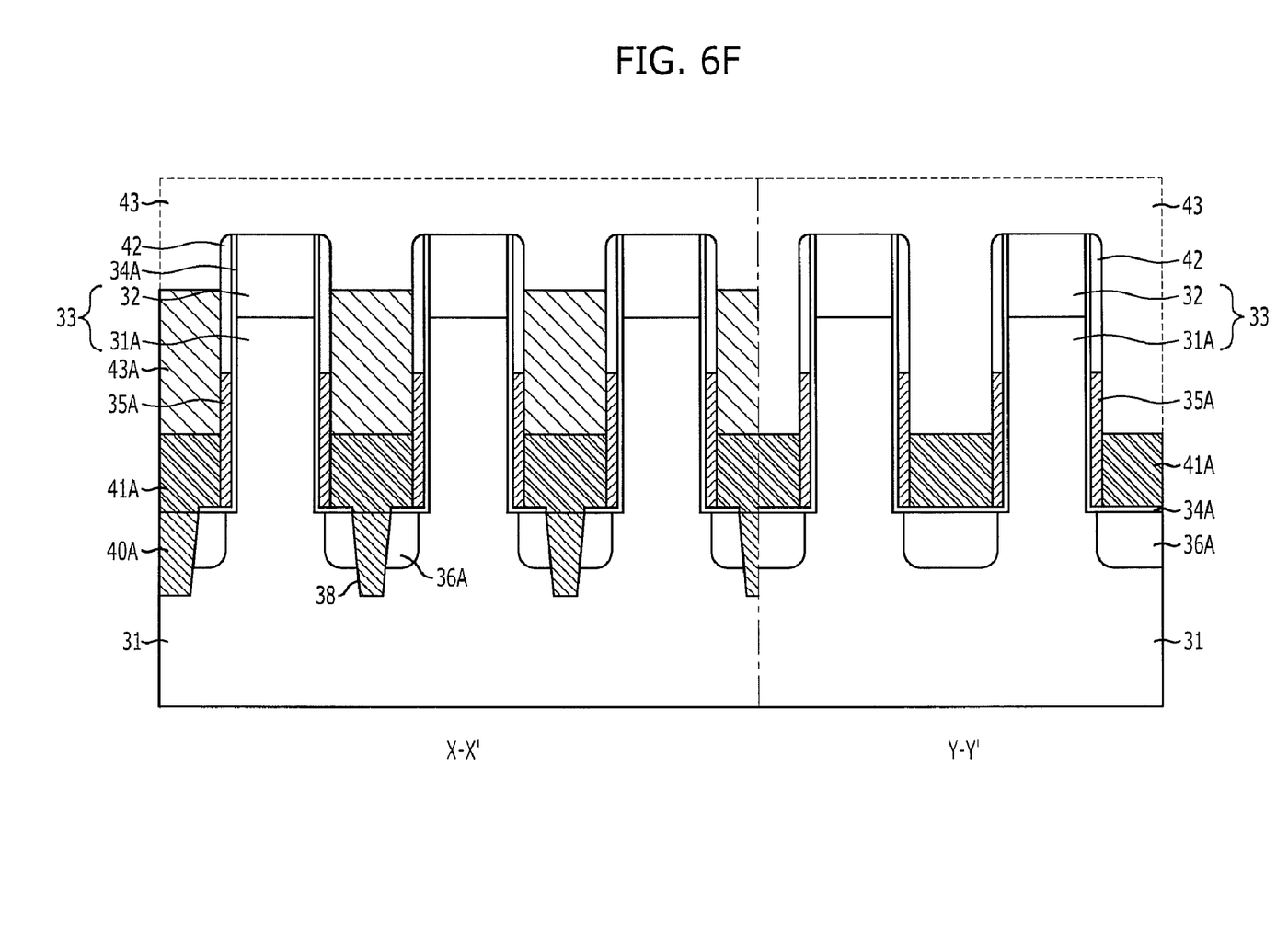

Referring to FIG. 6F, a conductive layer 43 is formed over the remaining second inter-layer insulation patterns 41A and buried between the pillar structures 33. For instance, the conductive layer 43 is formed in a manner that the conductive layer 43 is buried between the pillar structures 33 and covers the upper surfaces of the pillar structures 33. At this time, the conductive layer 43 is formed to form word lines and may include a silicon layer or a metallic layer. For instance, the conductive layer 43 may include a metallic layer. The conductive layer 43 may include a tungsten (W) layer.

A blanket etch process, e.g., an etch-back process, is performed on the conductive layer 43 in a manner that remaining portions of the conductive layer 43 have upper surfaces at a lower position than that of the pillar structures 33. For instance, the conductive layer 43 is etched in a manner that the upper surfaces of the remaining portions of the conductive layer 43 are at a lower position than the upper surfaces of the pillar structures 33 but at a higher position than the upper surfaces of the vertical gates 35A.

A photoresist pattern (not shown) is formed over the remaining portions of the conductive layer 43. The remaining portions of the conductive layer 43 are etched using the photoresist pattern as an etch barrier to form word lines 43A coupling adjacent vertical gates 35A. At this time, the etching process for forming the word lines 43A may be performed using a gas mixture of a gas including chlorine and a gas including fluorine. The gas including chlorine may include chlorine ($Cl_2$) gas, and the gas including fluorine may include sulfur hexafluoride ($SF_6$) gas. Note that, although word lines are formed by selectively etching an inter-layer insulation layer to form a damascene pattern and burying a conductive layer over the damascene pattern in the typical method, the word lines 43A are formed by directly patterning the conductive layer 43, without forming a damascene pattern, in accordance with the embodiment of the present invention.

In accordance with the embodiment of the present invention, a damascene pattern formation process may be omitted because the word lines 43A are formed by directly patterning the conductive layer 43, and thus improving process efficiency. Also, limitations which may arise from forming a damascene pattern may be prevented. Thus, generation of bridges at the end of word lines 43A in a padding region may be prevented.

Furthermore, the trenches 38 for forming the buried bit lines 36A are formed using the sacrificial layer 37 including BPSG. Thus, the pillar structures 33 may be prevented from collapsing even if a misalignment occurs while forming the trenches 38. Also, the spaces between pillar structures 33 may be increased because the remaining sacrificial layers 37A and the remaining passivation layers 39A are removed after the trenches 38 are formed.

Moreover, limitations which may arise from the difference between etch rates, or degrees of etching, applied to the inter-layer insulation layers using an etch gas or etch solution may be prevented during the etching processes because the first and second inter-layer insulation layers, i.e., the first inter-layer insulation patterns 40, the remaining first inter-layer insulation patterns 40A, the second inter-layer insulation patterns 41, and the remaining second inter-layer insulation patterns 41A, are formed using substantially the same material, i.e., SOD.

While the present invention has been described with respect to the specific embodiments, it will be apparent to those skilled in the art that various changes and modifications may be made without departing from the spirit and scope of the invention as defined in the following claims.

What is claimed is:

1. A method for fabricating a semiconductor device, comprising:
    forming a plurality of pillar structures over a substrate;
    forming gate electrodes over sidewalls of the pillar structures;
    forming a sacrificial layer buried between the pillar structures;
    selectively etching the sacrificial layer and the substrate to form trenches in the substrate;
    forming first inter-layer insulation patterns buried over the trenches and removing the remaining sacrificial layer at substantially the same time; and
    forming second inter-layer insulation patterns over the first inter-layer insulation patterns and buried between the pillar structures.

2. The method of claim 1, wherein the forming of the sacrificial layer comprises using a material having a smaller intra-layer stress than the first inter-layer insulation patterns.

3. The method of claim 2, wherein the sacrificial layer comprises a borophosphosilicate glass (BPSG) layer.

4. The method of claim 3, wherein the first inter-layer insulation patterns comprise a spin on dielectric (SOD) layer.

5. The method of claim 3, further comprising, before the forming of the sacrificial layer, forming a passivation layer over the substrate structure.

6. The method of claim 5, further comprising, after the removing of the remaining sacrificial layer, removing the passivation layer.

7. The method of claim 1, wherein the first inter-layer insulation patterns and the second inter-layer insulation patterns comprise substantially the same material.

8. The method of claim 2, wherein the forming of the first inter-layer insulation patterns buried over the trenches and the removing of the remaining sacrificial layer at substantially the same time comprises:
    forming a first inter-layer insulation layer buried over the trenches and between the pillar structures; and
    etching the first inter-layer insulation layer in a manner that the first inter-layer insulation patterns remain in the trenches and removing the remaining sacrificial layer at substantially the same time.

9. The method of claim 8, wherein the etching of the first inter-layer insulation layer and the removing of the remaining sacrificial layer at substantially the same time comprises using a gas including fluorine.

10. The method of claim 9, wherein the gas including fluorine comprises fluorocarbon gas.

11. The method of claim 10, wherein the fluorocarbon gas comprises octafluorocyclobutane ($C_4F_8$) gas.

12. The method of claim 1, further comprising, after the forming of the gate electrodes, performing an ion implantation process to implant impurities into portions of the substrate between the pillar structures to form impurity regions for forming buried bit lines.

13. A method for fabricating a semiconductor device, comprising:
    forming a plurality of pillar structures over a substrate;
    forming gate electrodes over sidewalls of the pillar structures;
    forming an inter-layer insulation layer buried between the pillar structures;
    performing a first recess-etch process to recess the inter-layer insulation layer to a certain thickness;
    etching portions of the gate electrodes exposed by the first recess-etch process to form vertical gates;
    performing a second recess-etch process to recess the remaining inter-layer insulation layer to a certain thickness, thereby exposing portions of the vertical gates;
    forming a conductive layer buried between the pillar structures; and
    etching the conductive layer to form word lines coupling adjacent vertical gates.

14. The method of claim 13, wherein the forming of the inter-layer insulation layer comprises using a spin on dielectric (SOD) layer.

15. The method of claim 14, wherein the performing of the first recess-etch process and the performing of the second recess-etch process comprise using a solution including fluorine.

16. The method of claim 15, wherein the solution including fluorine comprises buffered oxide etchant (BOE) and hydrogen fluoride (HF) solution.

17. The method of claim 13, further comprising, after the etching of the portions of the gate electrodes to form the vertical gates, forming spacers over sidewalls of exposed portions of the pillar structures.

18. The method of claim 17, wherein the spacers have a thickness substantially the same as a thickness of the vertical gates.

19. The method of claim 13, wherein the etching of the conductive layer to form the word lines comprises:
    performing a blanket etch process on the conductive layer in a manner that an upper surface of the etched conductive layer is at a lower position than that of the pillar structures; and
    etching the etched conductive layer using a photoresist pattern formed over the etched conductive layer.

20. The method of claim 19, wherein the performing of the blanket etch process comprises forming the upper surface of the etched conductive layer at a higher position than that of the vertical gates.

21. The method of claim 13, further comprising, after the forming of the gate electrodes:

performing an ion implantation process to implant impurities into portions of the substrate between the pillar structures to form impurity regions for forming buried bit lines;

forming a passivation layer over the substrate structure;

forming a sacrificial layer buried between the pillar structures;

selectively etching the sacrificial layer, the passivation layer, and the substrate to form trenches in the substrate; and removing the remaining sacrificial layer and passivation layer.

22. The method of claim 21, wherein the forming of the sacrificial layer comprises using a material having a smaller intra-layer stress than the inter-layer insulation layer.

* * * * *